US011825662B2

(12) United States Patent
Jacob et al.

(10) Patent No.: US 11,825,662 B2
(45) Date of Patent: Nov. 21, 2023

(54) FERROELECTRIC CAPACITOR, A FERROELECTRIC MEMORY CELL, AN ARRAY OF FERROELECTRIC MEMORY CELLS, AND A METHOD OF FORMING A FERROELECTRIC CAPACITOR

(71) Applicant: Micron Technology, Inc., Boise, ID (US)

(72) Inventors: Clement Jacob, Boise, ID (US); Vassil N. Antonov, Boise, ID (US); Jaydeb Goswami, Boise, ID (US); Albert Liao, Boise, ID (US); Christopher W. Petz, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 17/377,665

(22) Filed: Jul. 16, 2021

(65) Prior Publication Data

US 2021/0343732 A1 Nov. 4, 2021

Related U.S. Application Data

(62) Division of application No. 16/704,657, filed on Dec. 5, 2019, now Pat. No. 11,101,274.

(51) Int. Cl.
*H01L 21/00* (2006.01)
*H10B 53/30* (2023.01)
*H01L 21/02* (2006.01)
*H01L 49/02* (2006.01)

(52) U.S. Cl.
CPC ....... *H10B 53/30* (2023.02); *H01L 21/02175* (2013.01); *H01L 21/02244* (2013.01); *H01L 28/60* (2013.01)

(58) Field of Classification Search
CPC ......... H01L 27/11507; H01L 21/02175; H01L 21/02244; H01L 28/60; H10B 53/30
See application file for complete search history.

(56) References Cited

U.S. PATENT DOCUMENTS

| 7,049,232 | B2 | 5/2006 | Lee et al. |
| 8,642,796 | B2 | 2/2014 | Saito et al. |
| 9,331,139 | B2 | 5/2016 | Ashizawa et al. |
| 10,861,862 | B1 | 12/2020 | Lu |
| 10,937,809 | B1 | 3/2021 | Sharangpani et al. |
| 2004/0245492 | A1 | 12/2004 | Hamada et al. |

(Continued)

FOREIGN PATENT DOCUMENTS

JP         6439284         12/2018

OTHER PUBLICATIONS

WO, PCT/US2020/060109 Search Rep, dated Feb. 26, 2021, Micron Technology, Inc.

(Continued)

*Primary Examiner* — Richard A Booth
(74) *Attorney, Agent, or Firm* — Wells St. John P.S.

(57) ABSTRACT

A ferroelectric capacitor comprises two conductive capacitor electrodes having ferroelectric material there-between. At least one of the capacitor electrodes comprise $M_xSiO_y$, where "M" is at least one of Ru, Ti, Ta, Co, Pt, Ir, Os, Mo, V, W, Sr, Re, Rh, Pd, La, Zn, In, Sig, and Nb, Other aspects, including method, are disclosed.

36 Claims, 12 Drawing Sheets

(56) References Cited

U.S. PATENT DOCUMENTS

| | | | |
|---|---|---|---|
| 2006/0076597 A1 | 4/2006 | Agarwal et al. | |
| 2011/0318488 A1 | 12/2011 | Saito et al. | |
| 2012/0112156 A1* | 5/2012 | Park | H01L 27/101 |
| | | | 257/E45.002 |
| 2016/0240545 A1* | 8/2016 | Karda | H01L 28/40 |
| 2017/0287920 A1 | 10/2017 | Wang | |
| 2019/0148390 A1 | 5/2019 | Frank | |

OTHER PUBLICATIONS

WO, PCT/US2020/060109 Writt. Opin., dated Feb. 26, 2021, Micron Technology, Inc.

Tapajna et al., "Work function thermal stability of RuO2-rich Ru—Si—O p-channel metal-oxide-semiconductor field-effect transistor gate electrodes", Journal of Applied Physics, 2008, United States, 13 pages.

WO, PCT/US2020/060109 IPRP, May 17, 2022, Micron Technology, Inc.

* cited by examiner

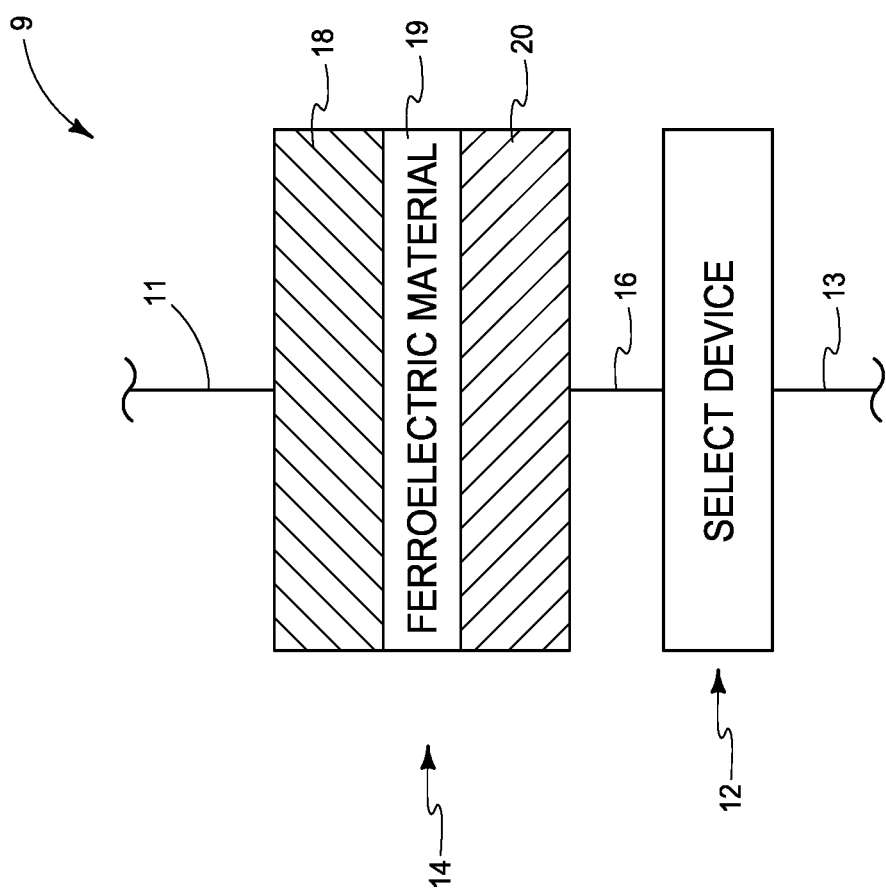

FERROELECTRIC CAPACITOR, A FERROELECTRIC MEMORY CELL, AN ARRAY OF FERROELECTRIC MEMORY CELLS, AND A METHOD OF FORMING A FERROELECTRIC CAPACITOR

RELATED PATENT DATA

This patent resulted from a divisional application of U.S. patent application Ser. No. 16/704,657, filed Dec. 5, 2019, entitled "A Ferroelectric Capacitor, A Ferroelectric Memory Cell, An Array Of Ferroelectric Memory Cells, And A Method Of Forming A Ferroelectric Capacitor", naming Clement Jacob, Vassil N. Antonov, Jaydeb Goswami, Albert Liao, Christopher W. Petz, and Durai Vishak Nirmal Ramaswamy as inventors, the disclosure of which is incorporated by reference.

TECHNICAL FIELD

Embodiments disclosed herein pertain to ferroelectric capacitors, to ferroelectric memory cells, and to methods of forming a ferroelectric capacitor.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as a charge may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, and in such instances, upon determining the polarization state, a re-write of the memory cell is conducted to put the memory cell into the pre-read state immediately after its determination. Regardless, a memory cell incorporating a ferroelectric capacitor ideally is non-volatile due to the hi-stable characteristics of the ferroelectric material that forms a part of the capacitor. Other programmable materials may be used as a capacitor insulator to render capacitors non-volatile.

One type of memory cell has a select device electrically coupled in series with a ferroelectric capacitor.

Capacitors may of course be used in integrated circuitry other than memory circuitry and fabricated into arrays that may or may not be at least part a memory array.

BRIEF DESCRIPTION OF THE DRAWINGS

FIG. 1 is a schematic-like diagrammatic view of a memory cell in accordance with an embodiment of the invention.

DETAILED DESCRIPTION OF EXAMPLE EMBODIMENTS

Figure 3:
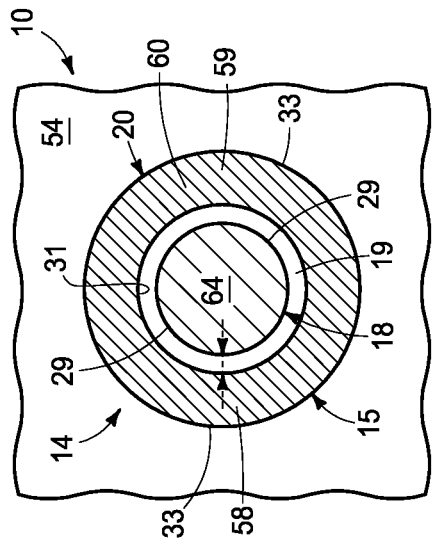
FIG. 3 is an enlarged cross-sectional view taken through line 3-3 in FIG. 2.

A memory cell 9 in accordance with an embodiment of the invention is shown and initially described with reference to a schematic-like FIG. 1. Integrated circuitry (not shown) having memory cell 9 would likely have thousands or millions of such memory cells fabricated relative to a memory array or sub-array. Such arrays or sub-arrays would likely have a plurality of wordlines and digitlines having individual memory cells 9 there-between where such cross. Individual memory cells may be considered as comprising the portions of an individual wordline and a crossing individual digitline.

Memory cell 9, in one embodiment, comprises a select device 12 and a capacitor 14 electrically coupled in series (i.e., circuit) with select device 12, for example by a conductive (i.e., electrically) path 16 as shown. Capacitor 14 in the depicted diagram may be considered as comprising two conductive capacitor electrodes 18 and 20 having ferroelectric material 19 there-between. Select device 12 when present may be any existing or future-developed select device, including multiple devices. Examples include diodes, field effect transistors (that may or may not include a reversibly programmable charge-storage region as part of their gate constructions), and bipolar transistors. Physically, path 16 may simply be a single electrode shared by capacitor 14 and select device 12.

A wordline and a digitline (neither shown in FIG. 1) may be associated with memory cell 9. For example, select device 12 when present may be a simple two terminal diode or other two terminal device. A cross point-like array construction may then be used whereby a conductive path 11 as part of capacitor electrode 18 connects with or is part of a wordline or digitline (not shown in FIG. 1) and a conductive path 13 as part of select device 12 connects with or is part of the other of a wordline or digitline (not shown in FIG. 1.). As an alternate example, select device 12 may be a field effect transistor. Then, as an example, conductive path 11 may be part of a capacitor electrode 18 that is common to multiple capacitors 14 (not shown in FIG. 1) within a memory array or sub-array, component 16 may be one source/drain region of the transistor, and component/conductive path 13 may be the other. The gate (not shown in FIG. 1) of the transistor may be a portion of a wordline (not shown in FIG. 1), and source/drain component 13 may connect with or be part of a digit line (not shown in FIG. 1). Other existing or future-developed architectures and constructions could alternately of course be used.

Figure 2:
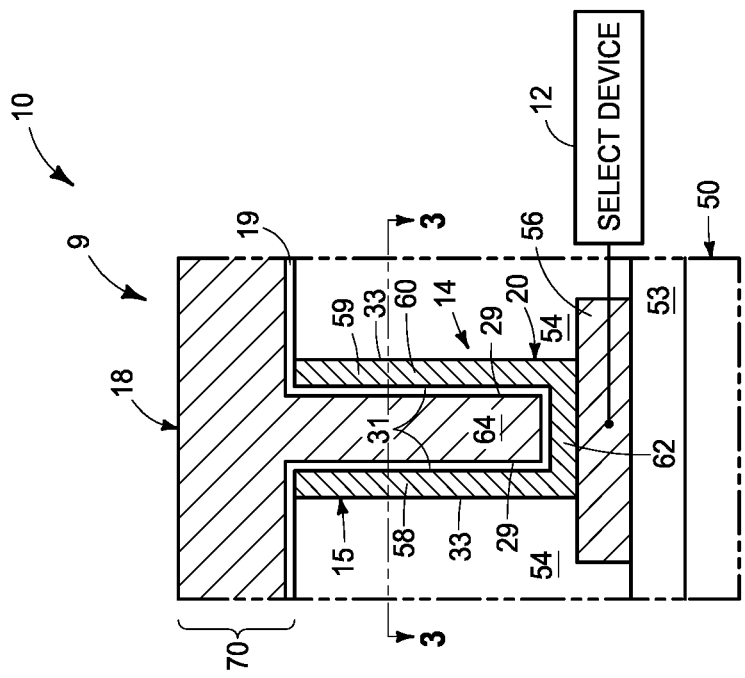
FIG. 2 is a diagrammatic cross-sectional view of a memory cell in accordance with an embodiment of the invention.

FIGS. 2 and 3 diagrammatically show an example physical construction of a portion of a memory cell 9. Such comprises capacitor 14 in accordance with an example embodiment of the invention. Like numerals from the above-described embodiments have been used where appropriate, with some differences or additions being indicated with different numerals. FIGS. 2 and 3 depict only a portion of a construction fragment 10 comprising a base substrate 50 (FIG. 2) that may include one or more materials that are one or more of conductive/conductor/conducting, semiconductive/semiconductor/semiconducting, or insulative/insulator/insulating (i.e., electrically herein). Various materials have been formed above base substrate 50. Materials may be aside, elevationally inward, or elevationally outward of the FIG. 2 and 3-depicted materials. For example, other partially or wholly fabricated components of integrated circuitry may be provided somewhere above, about, or within base substrate 50. Control and/or other peripheral circuitry for operating components within an array (e.g., a memory array) may also be fabricated and may or may not be wholly or partially within an array or sub-array. Further, multiple sub-arrays may also be fabricated and operated independently, in tandem, or otherwise relative one another. In this document, a "sub-array" may also be considered as an array. Select device 12 may be electrically coupled to either one of capacitor electrodes 18 or 20, with such shown being schematically connected to electrode 20 through a conductor 56.

An insulative-comprising material is shown as being above base substrate 50 and has a capacitor opening 15 therein. By way of example only, such is shown as comprising material 53 above base substrate 50 and material 54 above material 53. An example material 53 is silicon nitride above silicon dioxide. An example material 54 is doped silicon dioxide. Example construction 10 comprises lower conductor 56 which, for example, may be a conductive line running into and out of the plane of the page upon which FIG. 2 lies, for example a wordline or a digitline, or be electrically coupled (in one embodiment, directly electrically coupled) to or part of select device 12. An example conductive material for conductor 56 is TiN.

Example capacitor 14 comprises a first conductive capacitor electrode 20 comprising conductive material 60 that by way of example only has laterally-spaced walls 58 and 59 that individually have laterally-innermost surfaces 31 and laterally-outermost surfaces 33. In one embodiment, first capacitor electrode 20 has a bottom 62 extending laterally to and between laterally-spaced walls 58, 59. Alternately and by way of example only, first capacitor electrode 20 may comprise an upwardly and downwardly-open (not shown) conductive material cylinder (e.g., little or no bottom 62 extending between walls 58, 59). Capacitor 14 includes a second conductive capacitor electrode 18 having example lateral sidewall surfaces 29. Second capacitor electrode 18 is shown as comprising a conductive material 64 (e.g., TiN). Second capacitor electrode 18 may be considered as comprising a portion 70 that is above first capacitor electrode 20.

Ferroelectric material 19 is laterally-between second capacitor electrode 18 and first capacitor electrode 20, including laterally between walls 58, 59 of first capacitor electrode 20. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. Ferroelectric material 19 may be over laterally-outermost surfaces 33 (not shown).

The above-described construction is but one example physical capacitor construction 14 and any other existing or future-developed construction may be used.

Figure 4:
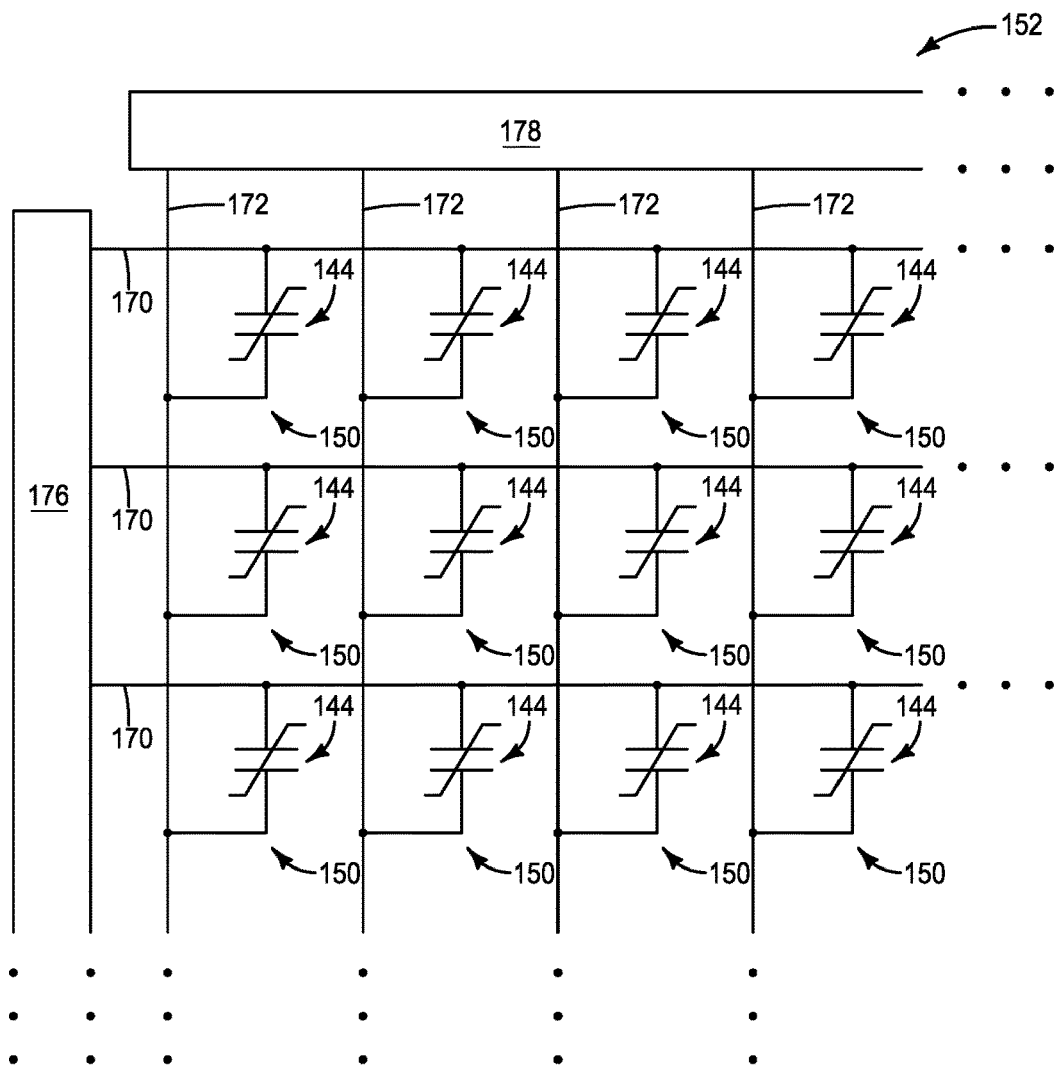
FIG. 4 is a schematic diagram of an example memory array comprising ferroelectric capacitors.

Memory arrays may incorporate ferroelectric capacitors as described above and may have any suitable configuration. An example ferroelectric memory array 152 is described with reference to FIG. 4. Memory array 152 includes a plurality of ferroelectric capacitors 144, for example that may be of the configuration of capacitor 14 described above. Wordlines 170 extend along rows of memory array 152 and digitlines 172 extend along columns of memory array 152. Each of capacitors 144 is within a memory cell 150 which is uniquely addressed using a combination of a wordline and a digitline. Wordlines 170 extend to driver circuitry 176 and digitlines 172 extend to detecting circuitry 178. In some applications, memory array 152 may be configured as ferroelectric random-access memory (FeRAM).

Figure 5:
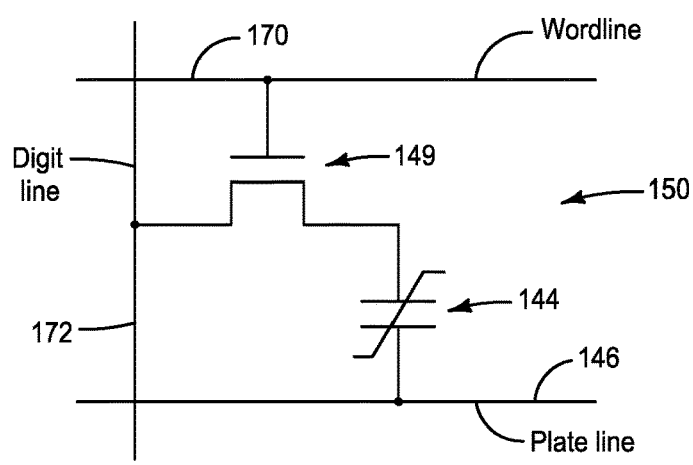
FIG. 5 is a schematic diagram of an example memory cell comprising a ferroelectric capacitor.

Memory cells 150 may include transistors 149 (e.g., select devices) in combination with ferroelectric capacitors 144. For instance, in some applications, each of memory cells 150 may include one of transistors 149 in combination with a ferroelectric capacitor 144 as shown in FIG. 5. Memory cell 150 is shown coupled with a wordline 170 and a digitline 172. Also, one of the electrodes of the capacitor 144 is shown coupled with a plate line comprising plate material 146 (e.g., a second capacitor electrode 18 as referred to in the above embodiments and that may be common to multiple capacitors in an array of the capacitors). The plate line may be used in combination with wordline 170 for controlling an operational state of one or more ferroelectric capacitors 144. Any other attribute(s) or aspect(s) as described herein and/or shown may be used.

Regardless, a ferroelectric capacitor and a ferroelectric memory cell in accordance with embodiments of the invention has at least one of the capacitor electrodes (e.g., 18 and/or 20) comprising $M_xSiO_y$, where "M" is at least one of Ru, Ti, Ta, Co, Pt, Ir, Os, Mo, V, W, Sr, Re, Rh, Pd, La, Zn, In, Sn, and Nb. In one embodiment, "M" is only one of Ru, Ti, Ta, Co, Pt, Ir, Os, Mo, V, W, Sr, Re, Rh, Pd, La, Zn, In, Sn, and Nb and in another embodiment "M" is more than one of Ru, Ti, Ta, Co, Pt, Ir, Os, Mo, V, W, Sr, Re, Rh, Pd, La, Zn, In, Sn, and Nb. In one ideal embodiment, "M" is at least one of Ru, Ti, Ta, Pt, Mo, V, W, and Nb, and in one such embodiment "M" is only one of Ru, Ti, Ta, Pt, Mo, V, W, and Nb. In one embodiment, "M" is Ru, and in one such embodiment is only Ru. In one embodiment, the $M_x SiO_y$ is composed of $MO_x$-rich nanograins embedded in an $SiO_2$-rich amorphous matrix, In one embodiment, "x" is 1 to 40 and in one ideal embodiment is 1 to 28. In one embodiment, "y" is 1 to 30, in one such embodiment is 1 to 20, and in one ideal such embodiment is 1 to 2.5. In one embodiment, only one of the two capacitor electrodes comprises the at least one of Ru, Ti, Ta, Co, Pt, Ir, Os, Mo, V, W, Sr, Re, Rh, Pd, La, Zn, In, Sn, and Nb, and in another embodiment both of the two capacitor electrodes comprise the at least one of Ru, Ti, Ta, Co, Pt, Ir, Os, Mo, V, W, Sr, Re, Rh, Pd, La, Zn, In, Sn, and Nb. In one embodiment, the ferroelectric capacitor is part of a memory cell and in one embodiment, comprises an array of such memory cells. In one embodiment, the memory cell comprises a select device electrically coupled to (in one embodiment directly electrically coupled to) one of the two capacitor electrodes. In one such embodiment, the select device is directly, electrically coupled to the at least one capacitor electrode that comprises the $M_xSiO_y$.

Any other attribute(s) or aspect(s) as shown and/or described herein with respect to other embodiments may be used.

Embodiments of the invention encompass methods of forming a ferroelectric capacitor, methods of forming a ferroelectric memory cell, and methods of forming an array of ferroelectric memory cells as well as a ferroelectric capacitor, a ferroelectric memory cell, and an array of ferroelectric memory cells as identified above independent of method of manufacture. Nevertheless, such methods may have any of the attributes as described above in structure embodiments. Likewise, the above-described structure embodiments may incorporate and form any of the attributes described below with respect to method embodiments. Example method embodiments are described with reference to FIGS. 6-13. Like numerals from above-described embodiments have been used for predecessor materials/constructions that result in a finished construction as shown, for example, in FIGS. 2 and 3.

Figure 6:
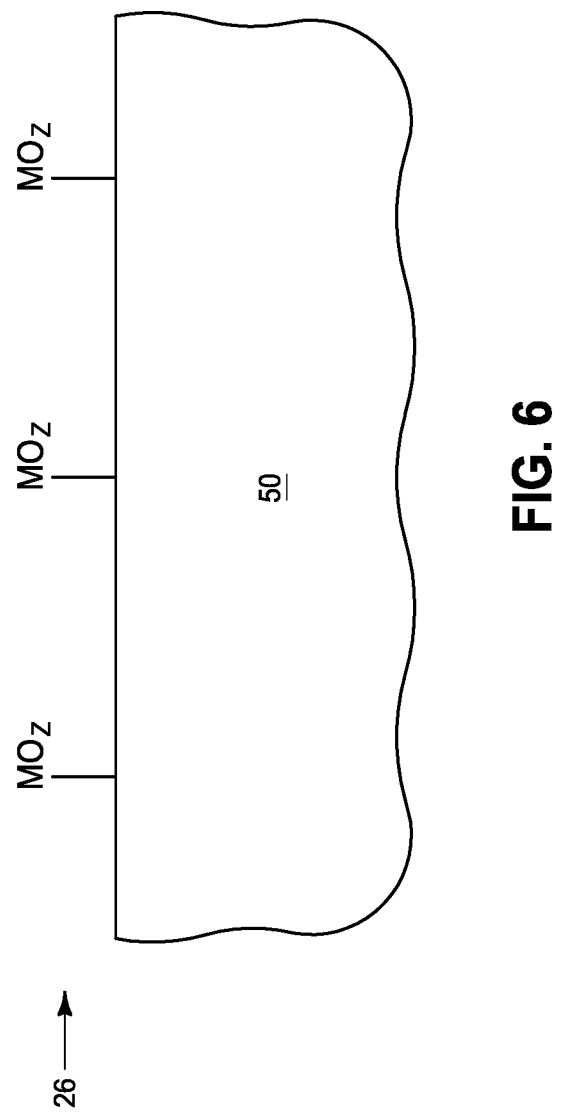
FIG. 6 is a diagrammatic cross-sectional view of a portion of a construction in process in accordance with some embodiments of the invention.

In one embodiment, a method of forming a ferroelectric capacitor comprises forming two conductive capacitor electrodes (e.g., 18 and 20) having ferroelectric material (e.g., 19) there-between. Referring to FIG. 6, an example such method comprises the forming of at least one of the capacitor electrodes includes (a): forming a metal oxide 26 (shown by way of example as $MO_z$) on a substrate 50, with the metal (e.g., "M") of the metal oxide comprising at least one of Ru, Ti, Ta, Co, Pt, Tr, Os, Mo, V, W, Sr, Re, Rh, Pd, La, Zn, In, Sn, and Nb. In one embodiment, the metal oxide of the (a) is stoichiometric. In another embodiment, the metal oxide of the (a) is not stoichiometric and in one such embodiment is stoichiometrically metal-rich has more atomic metal content than its stoichiometric metal oxide). In one embodiment, the forming of the (a) is by atomic layer deposition and in another embodiment is by chemical vapor deposition that is not atomic layer deposition.

Figure 7:
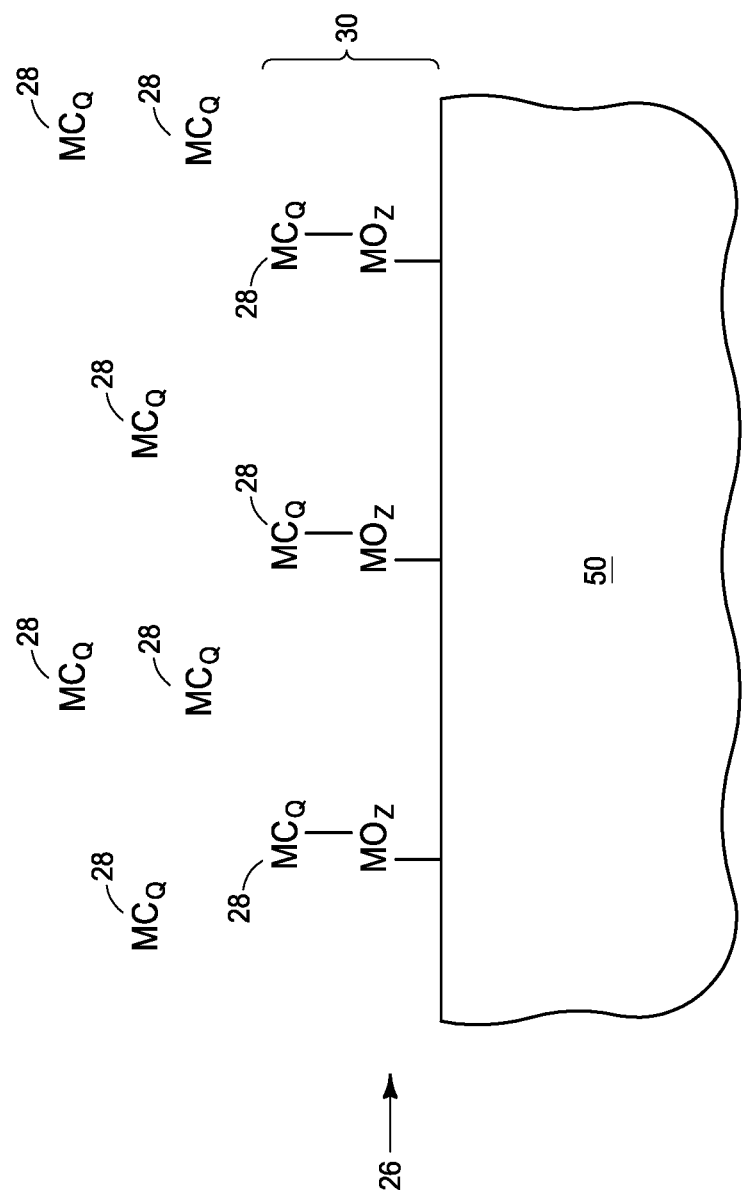
FIGS. 7-10 are diagrammatic sequential cross-sectional views of the construction of FIG. 6 in process in accordance with some embodiments of the invention.

Referring to FIG. 7, such method includes (b): metal oxide 26 has been contacted with a metal-organic precursor 28 (i.e., a gaseous and/or plasma substance containing both carbon and a metal element) (shown by way of example as $MC_Q$) to form a first solid reaction product 30 on substrate 50 that comprises metal-organic precursor 28 bonded to metal oxide 26. In one embodiment, the forming of the (a) comprises flowing the metal-organic precursor of the (b) to a chamber in which the substrate is received. In one embodiment and as shown, carbon of metal-organic precursor 28 is bonded to oxygen of metal oxide 26, Additionally, or alternately, another and/or an additional element(s) or group(s) of metal-organic precursor 28 may bond and/or adsorb to an atom or atoms of metal oxide 26 (not shown). The "metal" of metal-organic precursor 28 may be the same as the at least one of M. Any existing or future-developed metal-organic precursors may be used, for example and by way of example only any of those described in U.S. Pat. Nos. 9,331,139 and 7,049,232. Such refer to elemental-ruthenium-containing precursors. Alternate same precursors may be used but that have a substituted different elemental metal for the ruthenium, for example $Ti(Cp)_2$, $Pt(C_5H_5)_2$. $Rh(EtCp)_2$, $V(C_5H_4-C_2H_5)$, etc.

Figure 8:
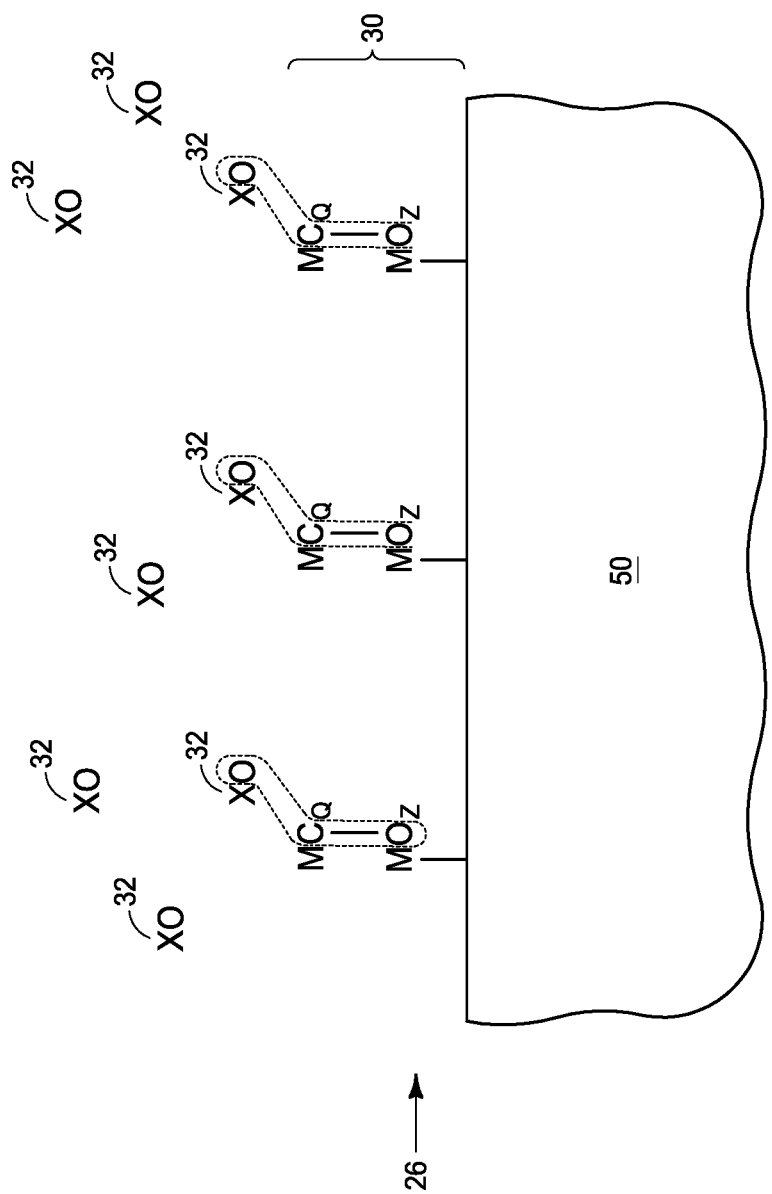
Figure 9:
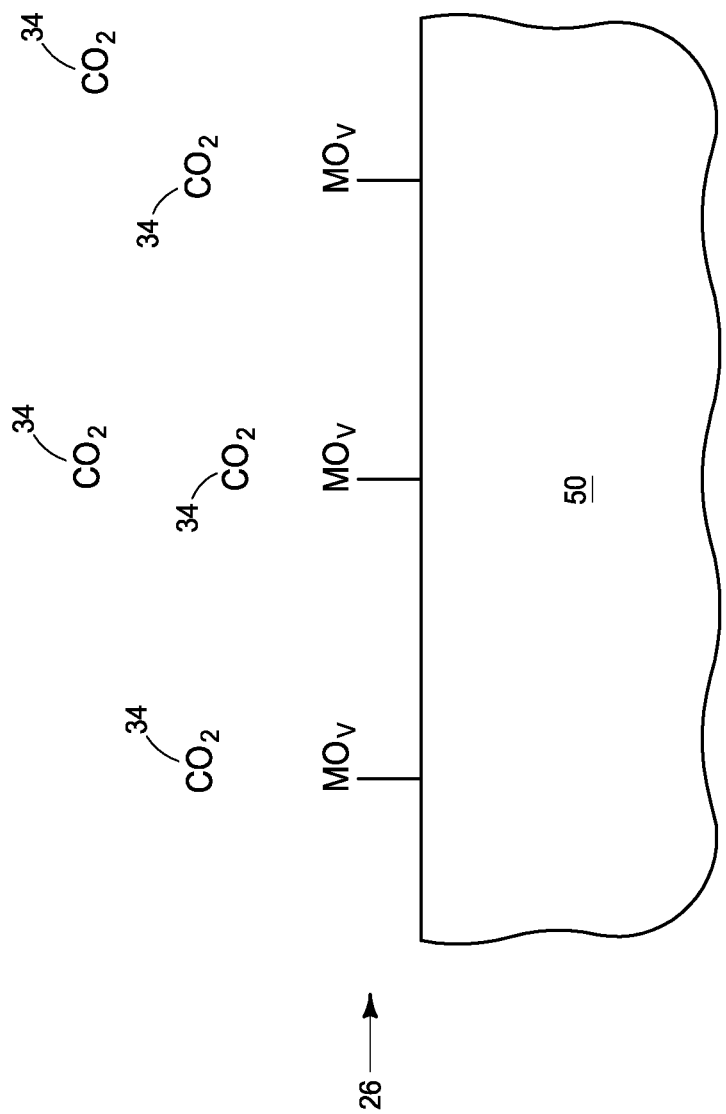

Referring to FIGS. 8 and 9, such method includes (c): first solid reaction product 30 has been contacted with an oxygen-containing precursor 32 (e.g., gaseous and/or plasma $O_2$, $O_3$, or other oxygen-containing species)(FIG. 8) (shown by way of example as XO) to form a second non-solid and non-liquid reaction product 34 (FIG. 9) and remaining metal oxide 26 (shown by way of example as $MO_v$) on substrate 50 to be stoichiometrically metal-rich. In one embodiment and as shown, second non-solid and non-liquid reaction product 34 comprises $CO_2$ (e.g., gaseous) formed from the bonded-carbon of first solid reaction product 30, the bonded-oxygen of first solid reaction product 30, and oxygen from oxygen-containing precursor 32. In one embodiment if original metal oxide 26 was already stoichiometrically metal-rich, the act of (c) increases content of the metal in the remaining metal oxide from the act of (a).

Figure 10:
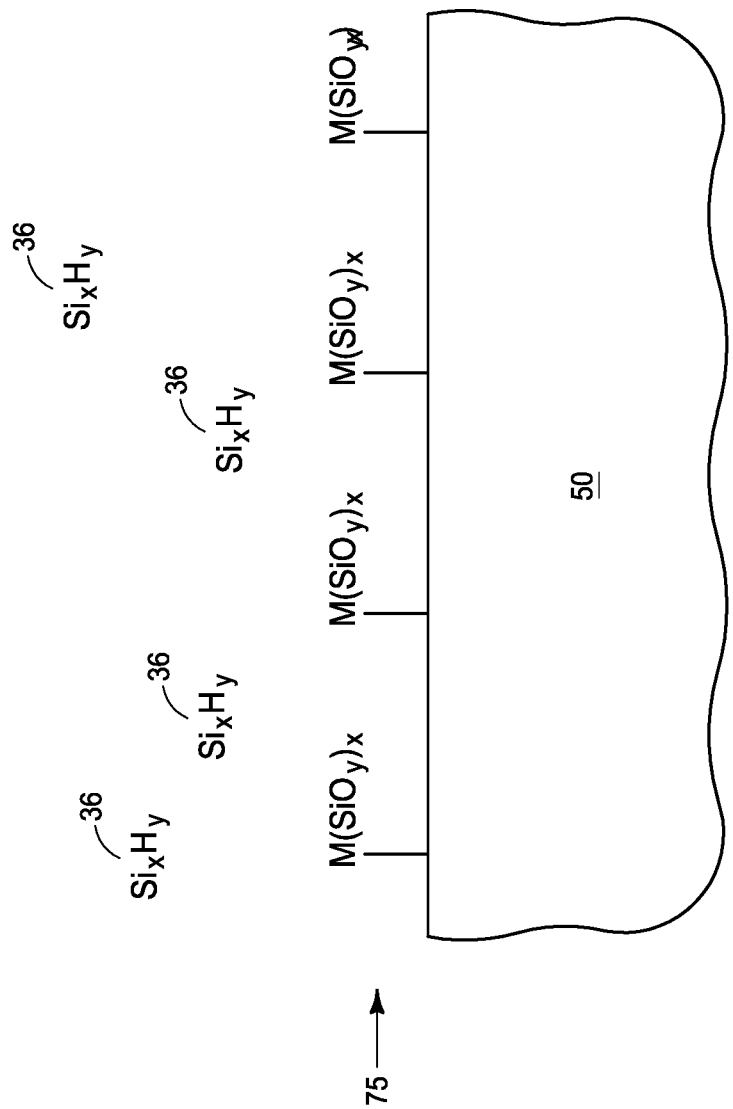

Referring to FIG. 10, such method includes (d): stoichiometrically metal-rich remaining metal oxide has been contacted with a silane 36 (e.g., $Si_xH_y$, $Si_ng_{2n+2}$, $SiHCl_3$, $Si(CH_3)_4$, $Si(OC_2h_5)_4$, etc.) to form the at least one capacitor electrode to comprise $M_xSiO_y$, 75, where "M" is the at least one of Ru, Ti, Ta, Co, Pt, Ir, Os, Mo, V, W, Sr, Re, Rh, Pd, La, Zn, In, Sn, and Nb.

In one embodiment, each of the (a), the (b), the (c), and the (d) occurs in situ in a chamber in which the substrate is received, and such a method further comprises purging the chamber using an inert gas between each of the (a) and the (b), the (b) and the (c), and the (c) and the (d). In one embodiment, the (a), the (b), the (c), and the (d) are sequentially repeated. In one embodiment, the (b) and the (c) are sequentially repeated before the (d). In one embodiment, the (b) and the (c) are sequentially repeated multiple times before the (d). In one embodiment, the (b) and the (c) are sequentially repeated multiple times before the contacting of the (d), and the (a), the (b), the (c), and the (d) are sequentially repeated multiple times after the multiple sequentially repeating the (b) and the (c), with the sequentially repeating the (a), the (b), the (c), and the (d) individually comprising said sequential repeating the (b) and the (c) multiple;

Any other attribute(s) or aspect(s) as shown and/or described herein with respect to other embodiments may be used.

Figure 11:
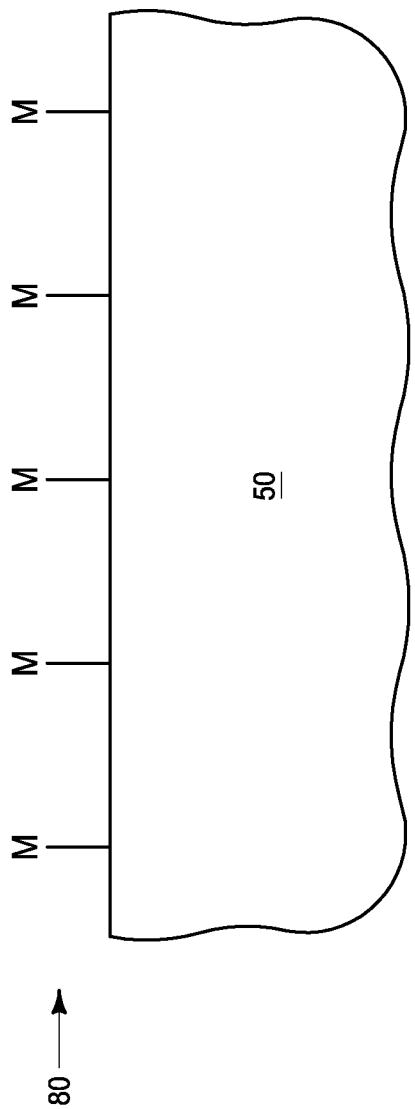
FIG. 11 is a diagrammatic cross-sectional view of a portion of a construction in process in accordance with some embodiments of the invention.

In one embodiment, a method of forming a ferroelectric capacitor comprises forming two conductive capacitor electrodes (e.g., 18 and 20) having ferroelectric material (e.g., 19) there-between. Referring to FIG. 11, such a method comprises the forming of at least one of the capacitor electrodes that includes (a): forming an elemental metal 80 or a metal alloy 80 (e.g., M) on a substrate 50. Elemental metal 80 or metal alloy 80 comprises at least one of Ti, Ta, Co, Pt, Ir, Os, Mo, V, W, Sr, Re, Rh, Pd, La, Zn, In, Sn, and Nb.

Figure 12:
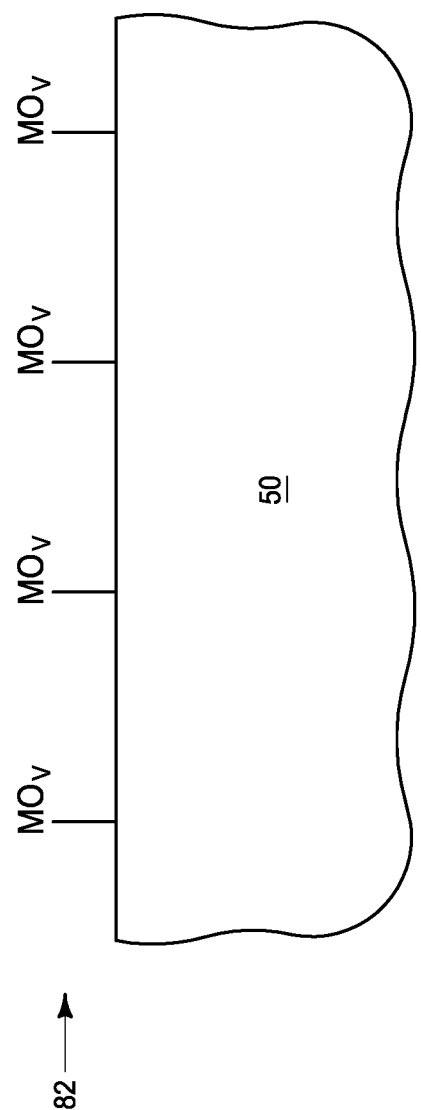
FIGS. 12 and 13 are diagrammatic sequential cross-sectional views of the construction of FIG. 11 in process in accordance with some embodiments of the invention.

Referring to FIG. 12, such method includes (b): elemental metal 80 (not shown) or metal alloy 80 (not shown) has been oxidized to form a metal oxide 82 (e.g., $MO_v$) on substrate 50 that is stoichiometrically metal-rich. Such may occur, for example, by increasing quantity/time of exposure to a metal-containing precursor as compared to an oxygen-containing precursor or by decreasing quantity/time of exposure to an oxygen-containing precursor as compared to a metal-containing precursor.

Figure 13:
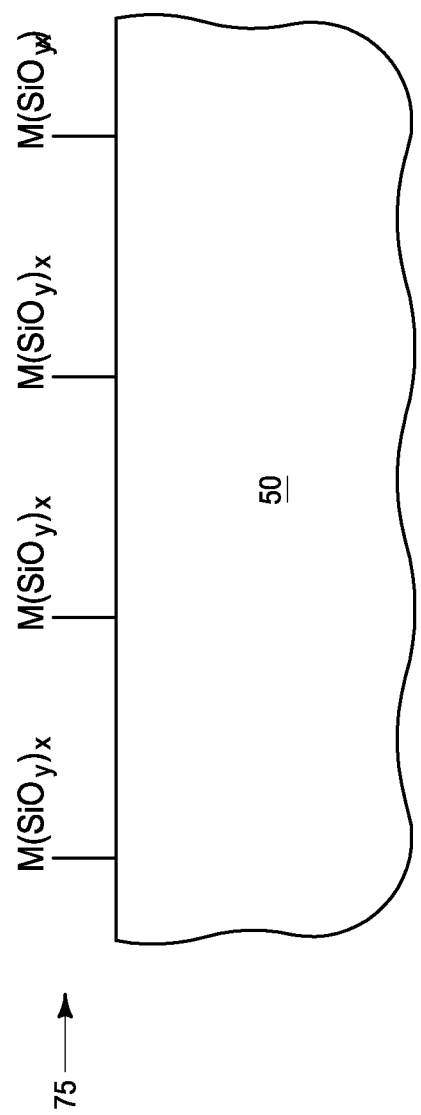

Referring to FIG. 13, stoichiometrically metal-rich remaining metal oxide 82 (not shown) has been contacted with a silane (e.g., as referred to above with respect to the description of the processing of FIG. 10) to form the at least one capacitor electrode to comprise $M_xSiO_y$ 75, where "M" is the at least one of Ru, Ti, Ta, Co, Pt, Ir, Os, Mo, V, W, Sr, Re, Rh, Pd, La, Zn, In, Sn, and Nb.

Any other attribute(s) or aspect(s) as shown and/or described herein with respect to other embodiments may be used.

The artisan is capable of selecting suitable deposition precursors and conditions (e.g., chamber temperature, chamber pressure, substrate temperature, chemistries, time, repetition and number of any cycles, flow rates, etc.) with respect to any of the above described processing including, for example, those as disclosed in U.S. Pat. Nos. 9,331,139 and 7,049,232. Further, and by way of example only, an example substrate temperature range is 150° C. to 300° C. and an example chamber pressure is 1 Torr to 100 Torr.

Figure 14:
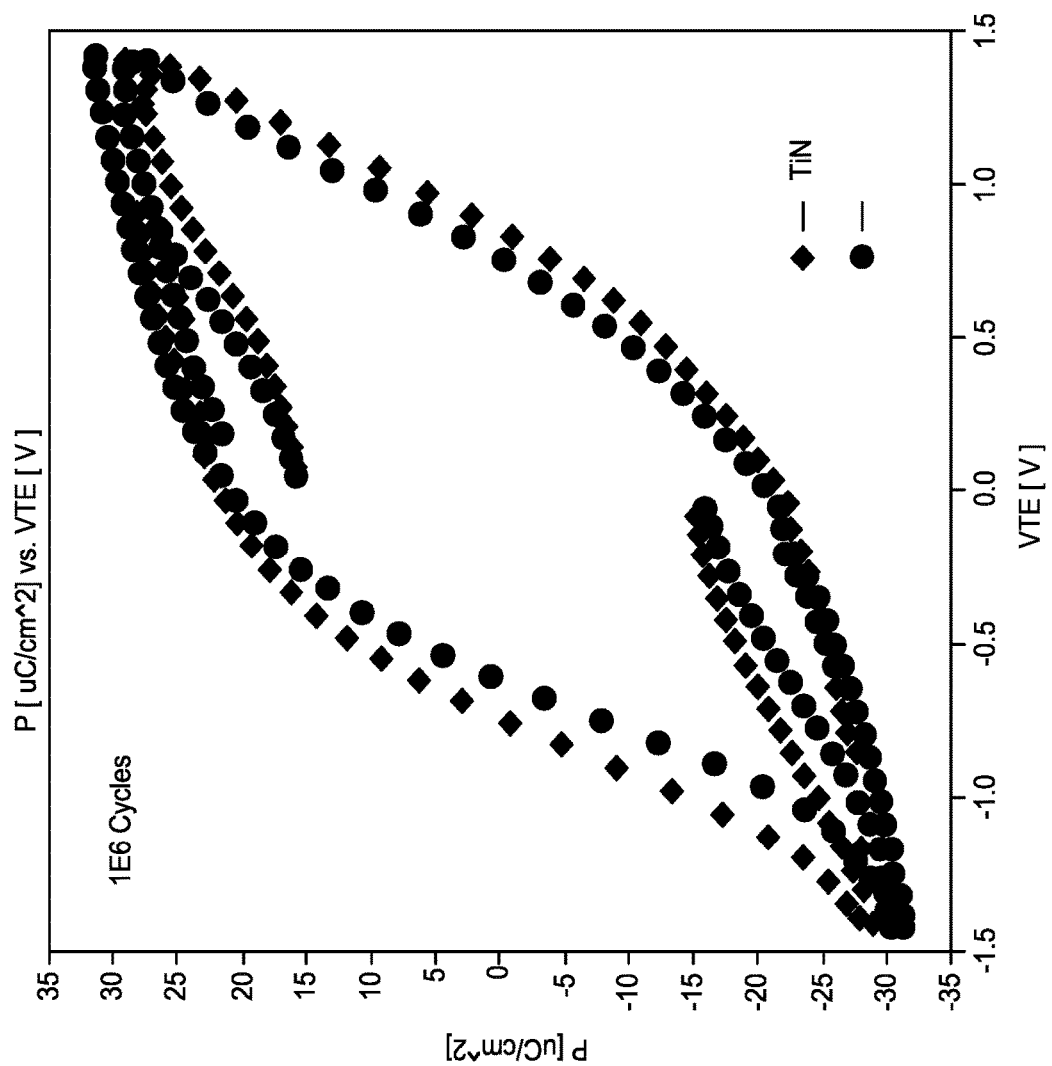
FIG. 14 is graph of polaripolarization as a function of top electrode voltage of an example inventive capacitor that is shown in FIG. 1 compared to a non-inventive capacitor of identical construction but for top electrode composition.

FIG. 14 is graph of polarization (in microcoulombs/cm²) as a function of top electrode voltage (in Volts) of an example inventive capacitor that is shown in FIG. 1 compared to a non-inventive capacitor of identical construction but for top electrode composition, and as measured after 1,000,000 program/erase cycles. Specifically, the squares are with respect to a non-inventive construction having the top electrode as TiN and the circles are with respect to an inventive construction having the top electrode as $Ru_{22}SiO$. The example inventive top electrode of $Ru_{22}SiO$ has steeper slope which is more desirable in ferroelectric capacitors.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational" "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) devotionally" refer to a direction that is angled away by at least 45° from exactly horizontal. Further, "extend(ing) devotionally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically, different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (other than the straight angle).

The composition any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a ferroelectric capacitor comprises two conductive capacitor electrodes having ferroelectric material there-between. At least one of the capacitor electrodes comprise $M_xSiO_y$, where "M" is at least one of Ru, Ti, Ta, Co, Pt, Ir, Os, Mo, V, W. Sr, Re, Rh, Pd, La, Zn, In, Sn, and Nb.

In some embodiments, a ferroelectric memory cell comprises two conductive capacitor electrodes having ferroelectric material there-between. At least one of the capacitor electrodes comprise $M_xSiO_y$, where "M" is at least one of Ru, Ti, Ta, Co, Pt, Ir, Os, Mo, V, W, Sr, Re, Rh, Pd, La, Zn, In, Sn, and Nb. A select device is electrically coupled to one of the two capacitor electrodes.

In some embodiments, an array of ferroelectric memory cells comprises memory cells that individually comprise two conductive capacitor electrodes having ferroelectric material there-between. At least one of the capacitor electrodes comprise $M_xSiO_y$, where "M" is at least one of Ru, Ti, Ta, Co, Pt, Ir, Os, Mo, V, W, Sr, Re, Rh, Pd, La, Zn, In, Sn, and Nb. A select device is electrically coupled to one of the two capacitor electrodes.

In some embodiments, a method of forming a ferroelectric capacitor comprises forming two conductive capacitor electrodes having ferroelectric material there-between. The forming of at least one of the capacitor electrodes sequentially comprise (a) forming a metal oxide on a substrate, the metal of the metal oxide comprising at least one of Ru, Ti, Ta, Co, Pt, Ir, Os, Mo, V, W, Sr, Re, Rh, Pd, La, Zn, in, Sn, and Nb, (b) contacting the metal oxide with a metal-organic precursor to form a first solid reaction product on the substrate comprising the metal-organic precursor bonded to the metal oxide, (c) contacting the first solid reaction product with an oxygen-containing precursor to form a second non-solid and non-liquid reaction product and remaining metal oxide on the substrate that is stoichiometrically metal-rich, and (d) contacting the stoichiometrically metal-rich remaining metal oxide with a silane to form the at least one capacitor electrode to comprise $M_xSiO_y$, where "M" is the at least one of Ru, Ti, Ta, Co, Pt, Ir, Os, Mo, V. W, Sr, Re, Rh, Pd, La, Zn, In, Sn, and Nb.

In some embodiments, a method of forming a ferroelectric capacitor comprises forming two conductive capacitor electrodes having ferroelectric material there-between. The forming of at least one of the capacitor electrodes sequentially comprise (a) forming a metal oxide on a substrate, the metal of the metal oxide comprising at least one of Ru, Ti, Ta, Co, Pt, Ir, Os, Mo, V, W, Sr, Re, Pd, La, Zn, In, Sn, and Nb, (b) contacting the metal oxide with a metal-organic precursor to form a first solid reaction product on the substrate comprising the metal-organic precursor bonded to the metal oxide, carbon of the metal-organic precursor being bonded to oxygen of the metal oxide, (c) contacting the first solid reaction product with an oxygen-containing precursor to form a second non-solid and non-liquid reaction product and remaining metal oxide on the substrate that is stoichiometrically metal-rich, the second non-solid and non-liquid reaction product comprising $CO_2$ formed from the bonded-carbon of the first solid reaction product, the bonded-oxygen of the first solid reaction product, and oxygen from the oxygen-containing precursor, and (d) contacting the stoichiometrically metal-rich remaining metal oxide with a silane to form the at least one capacitor electrode to comprise $M_xSiO_y$, where "M" is the at least one of Ru, Ti, Ta, Co, Pt, Ir, Os, Mo, V, W, Sr Re, Rh, Pd, La, Zn, In, Sn, and Nb.

In some embodiments, a method of forming a ferroelectric capacitor comprises forming two conductive capacitor electrodes having ferroelectric material there-between. The forming of at least one of the capacitor electrodes sequentially comprise (a) forming an elemental metal or a metal alloy on a substrate, the elemental metal or metal alloy comprising at least one of Ru, Ta, Co, Pt, Ir, Os, Mo, V, W, Sr, Re, Rh, Pd, La, Zn, In, Sn, and Nb, (b) oxidizing the elemental metal or metal alloy to form a metal oxide on the substrate that is stoichiometrically metal-rich, and (c) contacting the stoichiometrically metal-rich remaining metal oxide with a silane to form the at least one capacitor electrode to comprise $M_xSiO_y$, where "M" is the at least one of Ru, Ti, Ta, Co, Pt, Ir, Os, Mo, V, W, Sr, Re, Rh, Pd, La, Zn, In, Sn, and Nb.

In some embodiments regarding "M" is at least Ti. In some embodiments regarding $M_xSiO_y$, "M" is at least Ta. In some embodiments regarding $M_xSiO_y$, "M" is at least Co. In some embodiments regarding $M_xSiO_y$, "M" is at least Pt. In some embodiments regarding $M_xSiO_y$, "M" is at least Ir. In some embodiments regarding $M_xSiO_y$, "M" is at least. Os. In some embodiments regarding $M_xSiO_y$, "M" is at least Mo. In some embodiments regarding $M_xSiO_y$, "M" is at least V. In some embodiments regarding $M_xSiO_y$, "M" is at least W. In some embodiments regarding $M_xSiO_y$, "M" is at least Sr. In some embodiments regarding $M_xSiO_y$, "M" is at least Re, In some embodiments regarding $M_xSiO_y$, "M" is at least Rh. In some embodiments regarding $M_xSiO_y$, "M" is at least Pd. In some embodiments regarding $M_xSiO_y$, "M" is at least La. In some embodiments regarding $M_xSiO_y$, "M" is at least Zn. In some embodiments regarding $M_xSiO_y$, "M" is at least Zn. In some embodiments regarding $M_xSiO_y$, "M" is at least In. In some embodiments regarding $M_xsiO_y$, "M" is at least Sn. In some embodiments regarding $M_xSiO_y$, "M" is at least Nb.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A ferroelectric capacitor comprising:
two conductive capacitor electrodes having ferroelectric material there-between, at least one of the capacitor electrodes comprising:
$M_xSiO_y$, where "M" is at least one of Ta, Co, Pt, Ir, Os, Mo, V, W, Sr, Re, Rh, Pd, La, Zn, In, Sn, and Nb.

2. A ferroelectric capacitor comprising:
two conductive capacitor electrodes having ferroelectric material there-between, at least one of the capacitor electrodes comprising:
$M_xSiO_y$, where "M" is at least one of Ru, Ti, Ta, Co, Pt, Ir, Os, Mo, V, W, Sr, Re, Rh, Pd, La, Zn, In, Sn, and Nb, "M" being more than one of Ru, Ti, Ta, Co, Pt, Ir, Os, Mo, V, W, Sr, Re, Rh, Pd, La, Zn, In, Sn, and Nb.

3. The ferroelectric capacitor of claim 1 wherein "y" is 1 to 30.

4. The ferroelectric capacitor of claim 3 wherein "y" is 1 to 20.

5. The ferroelectric capacitor of claim 4 wherein "y" is 1 to 2.5.

6. The ferroelectric capacitor of claim 1 wherein "x" is 1 to 40.

7. The ferroelectric capacitor of claim 6 wherein "x" is 1 to 28.

8. The ferroelectric capacitor of claim 1 wherein "x" is 1 to 40 and "y" is 1 to 30.

9. The ferroelectric capacitor of claim 8 wherein "x" is 1 to 28 and "y" is 1 to 2.5.

10. A ferroelectric capacitor comprising:
two conductive capacitor electrodes having ferroelectric material there-between, at least one of the capacitor electrodes comprising:
$M_xSiO_y$, where "M" is at least one of Ru, Ti, Ta, Co, Pt, Ir, Os, Mo, V, W, Sr, Re, Rh, Pd, La, Zn, In, Sn, and Nb, the $M_xSiO_y$ comprising $MO_x$-rich nanograins embedded in an $SiO_2$-rich amorphous matrix.

11. The ferroelectric capacitor of claim 1 wherein the ferroelectric capacitor is part of a memory cell.

12. The ferroelectric capacitor of claim 11 comprising an array of said memory cells.

13. A ferroelectric memory cell comprising:
two conductive capacitor electrodes having ferroelectric material there-between, at least one of the capacitor electrodes comprising:
$M_xSiO_y$, where "M" is at least one of Ta, Co, Pt, Ir, Os, Mo, V, W, Sr, Re, Rh, Pd, La, Zn, In, Sn, and Nb; and
a select device electrically coupled to one of the two capacitor electrodes.

14. The ferroelectric memory cell of claim 13 wherein the select device is directly electrically coupled to the at least one capacitor electrode that comprises the $M_xSiO_y$.

15. An array of ferroelectric memory cells, the memory cells individually comprising:
two conductive capacitor electrodes having ferroelectric material there-between, at least one of the capacitor electrodes comprising:
$M_xSiO_y$, where "M" is at least one of Ta, Co, Pt, Ir, Os, Mo, V, W, Sr, Re, Rh, Pd, La, Zn, In, Sn, and Nb; and
a select device electrically coupled to one of the two capacitor electrodes.

16. The ferroelectric capacitor of claim 10 wherein the ferroelectric capacitor is part of a memory cell.

17. The ferroelectric capacitor of claim 16 comprising an array of said memory cells.

18. The ferroelectric capacitor of claim 10 wherein "M" is at least one of Ru, Ti, Ta, Pt, Mo, V, W, and Nb.

19. The ferroelectric capacitor of claim 10 wherein "M" is at least one of Ti, Ta, Pt, Mo, V, W, and Nb.

20. The ferroelectric capacitor of claim 1 wherein "M" comprises Ta.

21. The ferroelectric capacitor of claim 1 wherein "M" comprises Co.

22. The ferroelectric capacitor of claim 1 wherein "M" comprises Pt.

23. The ferroelectric capacitor of claim 1 wherein "M" comprises Ir.

24. The ferroelectric capacitor of claim 1 wherein "M" comprises Os.

25. The ferroelectric capacitor of claim 1 wherein "M" comprises Mo.

26. The ferroelectric capacitor of claim 1 wherein "M" comprises V.

27. The ferroelectric capacitor of claim 1 wherein "M" comprises W.

28. The ferroelectric capacitor of claim 1 wherein "M" comprises Sr.

29. The ferroelectric capacitor of claim 1 wherein "M" comprises Re.

30. The ferroelectric capacitor of claim 1 wherein "M" comprises Rh.

31. The ferroelectric capacitor of claim 1 wherein "M" comprises Pd.

32. The ferroelectric capacitor of claim 1 wherein "M" comprises La.

33. The ferroelectric capacitor of claim 1 wherein "M" comprises Zn.

34. The ferroelectric capacitor of claim 1 wherein "M" comprises In.

35. The ferroelectric capacitor of claim 1 wherein "M" comprises Sn.

36. The ferroelectric capacitor of claim 1 wherein "M" comprises Nb.

* * * * *